Aug. 21, 1962 D. V. SINNINGER 3,050,693
VARIABLE OSCILLATOR CIRCUIT UTILIZING REVERSE BIASED DIODES
FOR OPERATION AT A PREDETERMINED FREQUENCY
Filed April 28, 1960

INVENTOR.
Dwight V. Sinninger
BY
Olson, Mecklenburger, von Holst
Pendleton & Neuman
Att'ys United States Patent Office
3,050,693
Patented Aug. 21, 1962

3,050,693

VARIABLE OSCILLATOR CIRCUIT UTILIZING REVERSE BIASED DIODES FOR OPERATION AT A PREDETERMINED FREQUENCY

Dwight V. Sinninger, Oak Park, Ill., assignor to Senn Custom, Inc., Oak Park, Ill., a corporation of Illinois Filed Apr. 28, 1960, Ser. No. 25,404
12 Claims. (Cl. 331—10)

Figure 1:
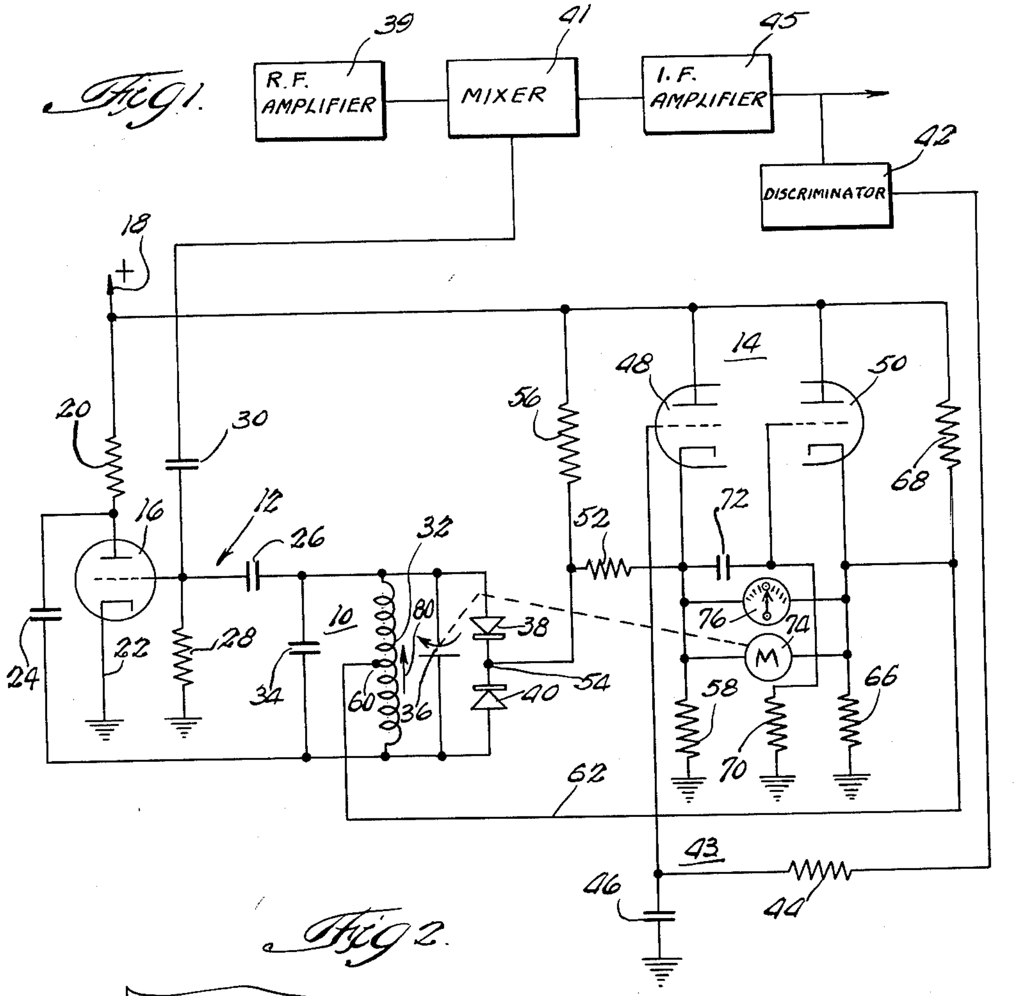

This invention relates to an oscillatory circuit and more particularly to means for automatically controlling the frequency of an oscillatory circuit.

Throughout the field of electronics tuned circuits are extensively used in oscillators, mixers or conversion stages, tuned amplifiers, filters and the like. Some such circuits are manually adjustable or tunable by changing the magnitude by either an inductance or a capacitance to vary the oscillatory frequency of the circuit. Others are permanetnly tuned to one frequency. For example, many filters and tuned amplifiers are fixed so that no variation in the oscillatory or resonant frequency is anticipated or desired. Still others, usually appearing in conversion stages, require minor tuning in order to control the operation of the equipment and maintain a frequency standard. The latter minor tuning is generally designated "automatic frequency control" and this control has been obtained in the past with various circuits and techniques and with varying degrees of success.

The instant invention is especially well adapted for automatic frequency control, familiarly designated AFC, although the techniques and circuits described hereinafter have many applications where accurate capacitance adjustment is required.

One typical use of automatic frequency control and valuable use of the instant invention is in the tuning of the conversion or first detector stage of radio receiving apparatus. There it is desired to generate a signal having a predetermined frequency in an oscillator and mix that signal with an incoming signal to produce an intermediate frequency signal having a center or optimum value corresponding to the subsequent pretuned stages. A discriminator will detect the center frequency and generate a direct current voltage proportional to the average deviation of the intermediate frequency from the optimum and this signal can be used for adjusting the conversion stage.

The adjustment of the conversion stage has in one typical prior art technique been accomplished by using a reactance tube or a tube connected in the tank circuit of the oscillator with a variable phase shift network whereby the tube would appear as a complete equivalent of a variable reactance. These techniques have not been wholly satisfactory as they involve relatively complex and expensive circuits and do not possess the desired reliability and accuracy.

It is therefore one object of this invention to provide a novel circuit for automatically tuning oscillatory or resonant circuits.

It is another object of this invention to provide a simple circuit which may be incorporated in various electronic equipment for automatically tuning oscillatory circuits without imposing any serious load upon the signal circuits and without substantially lowering the Q of the circuits.

It is still a further object of this invention to provide a novel circuit for automatic frequency control which is not subject to erratic operation, transient phenomena, regeneration or other forms of instability.

It is another object of this invention to provide a novel automatic frequency control circuit which compensates for transient phenomena through the use of a unique rate damping circuit.

Another object of this invention is the provision of an automatic frequency control circuit which incorporates a balanced control input whereby all fluctuations in heater supply, plate voltage, tube characteristics and the like may be compensated.

Further and additional objects of this invention will become manifest from a consideration of this specification, the accompanying drawing and the appended claims.

In one form of this invention an automatic frequency control circuit is provided for a local oscillator in which a D.C. control voltage from a discriminator is applied to a balanced D.C. amplifier and impedance transforming circuit which in turn applies D.C. control signals at nodal points of a tuned circuit. The D.C. control signals automatically vary the capacitance of two opposed capacitor diodes forming a part of the tuned circuit.

Means is provided in the balanced input circuit to eliminate variations in frequency which might otherwise result from transient action in the circuit and further means is provided for properly biasing the capacitor diodes without undue loading of any of the circuit components.

Figure 2:
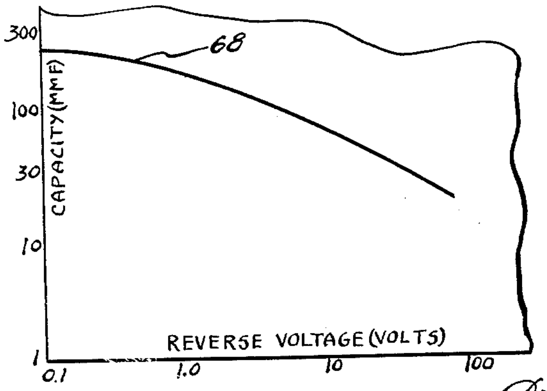

For a more complete understanding of this invention reference will now be made to the accompanying drawing wherein:

FIG. 1 is a circuit diagram of an automatic frequency control circuit illustrating one embodiment of this invention; and FIG. 2 is a chart showing the characteristic curve of one typical capacitor diode.

Referring now to the drawings, FIG. 1 is a schematic diagram of a tuned circuit 10 incorporated in an oscillator 12 and adjusted by a balanced control circuit 14. The oscillator 12 is of a conventional type having the tank circuit 10 in a feedback path between the plate and grid of a triode 16. The instant invention is obviously adapted for use with any tuned circuit whether it is employed with an oscillator or not and irrespective of the type of oscillator which is employed.

In the disclosed embodiment, triode 16 is connected to a source of positive D.C. potential 18 through a plate resistor 20. The cathode of triode 16 is connected directly to ground through conductor 22. The plate signal is applied through coupling capacitor 24 to one end of the tank circuit 10 and the regenerative voltage from the tank is applied through a coupling condenser 26 to the grid of triode 16. Grid bias is provided by grid resistor 28 which is connected to ground and the output of the oscillator is taken through condenser 30 and applied to a conversion stage. The tank circuit 10 in the disclosed embodiment includes a center tapped inductance 32, a fixed capacitor 34, a mechanically variable capacitor 36 and capacitor means comprising two capacitor diodes 38 and 40 connected in opposed or back to back relationship. The fixed capacitor 34, inductance 32, mechanically variable capacitor 36 and capacitor means including diodes 38 and 40 are all connected in parallel to form an oscillatory tank circuit. For adjusting the frequency of the tank circuit without upsetting the balance and nodal operation of the bias circuit a movable powdered iron core represented by arrow 80 is associated with inductance 32. This functions as a trimmer although a capacitance to ground and other means could be employed for the purpose.

As is well known, the capacitances which are connected in parallel are merely additive and the circuit will function for all purposes as though the capacitances were lumped into a single element. In fact, in some embodiments of this invention it may be desirable and it is completely feasible to omit fixed capacitor 34 and capacitor 36 and rely solely upon the capacitance diodes 38 and 40. The diodes 38 and 40 have a fairly substantial series resistance resulting from the nature of the devices and their assembly. Thus, in a circuit relying solely upon the diodes for capacitance the Q of the circuit will be somewhat reduced and in the typical embodiment at least the fixed capacitance 34 will be employed.

Capacitance diodes 38 and 40 are relatively new devices manufactured of silicon and comprising three distinct semi-conductive zones. One common diode is manufactured by the alloyed junction technique whereby the silicon has a P zone with an excess of positive carriers, an N zone with an abundance of negative carriers, and a very thin intermediate depletion zone where relatively few of the carriers of either polarity are present. Such a device has a high impedance to voltages of one polarity and a relatively low impedance when the polarity is reversed, thus constituting a unilateral device or rectifier. It has been found that in applying voltages in the reverse direction, that is, with polarities such that the diode reflects a high impedance, the depletion zone varies in width generally in accordance with the magnitude of the applied voltage. Under those conditions, the depletion zone corresponds to the dielectric of a capacitor whereby the diode when reverse biased acts as a variable capacitor with the capacitance inversely related to the voltage magnitude. The relationship of capacity to voltage for one particular diode is illustrated by curve 68 in FIG. 2. The illustrated characteristic is that of diode HC7005, manufactured by Hughes Products Division of Hughes Aircraft Co. From the figure it can be seen that for a reverse voltage of 0.1 volt an effective capacitance in the order of 250 mmf. appears, while at ten volts reverse bias the capacitance is only in the order of 50 mmf. This variation in capacitance with reverse bias voltage is used to great advantage in the instant invention.

The control circuit for providing the necessary reverse bias on the diodes will now be described. For convenience in explaining the invention a block diagram of one possible receiver is shown including an RF amplifier 39 which energizes a mixer 41 along with the output of the oscillator 12 to produce an intermediate frequency such as 355 kc. which in turn is applied to an IF amplifier 45. The signal from IF amplifier 45 is applied to a discriminator 42 which generates a D.C. voltage varying in magnitude and polarity in accordance with variations in the IF signal frequency from the predetermined value.

The D.C. voltage related to frequency and generated in discriminator 42 is applied through a low pass filter network 43 including resistor 44 and capacitor 46 to the control grid of triode 48. Triode 48 and triode 50 form the two amplifier components of the balanced D.C. power amplifier 14. The output of amplifier 14 is taken at the cathode of triode 48 and applied through resistor 52 to the junction 54 between the opposed diodes 38 and 40. The junction 54 is maintained at a predetermined voltage above ground by the voltage dividing resistance network including a large resistor 56, resistor 52 and cathode resistor 58.

In a similar manner the center tap 60 of inductance 32 is connected through conductor 62 to a voltage dividing resistance network including large resistor 64 and a cathode resistor 66 associated with triode section 50. Center tap 60 constitutes a nodal point with respect to junction 54 in the tank circuit 10. Thus there is minimum A.C. potential betwen the nodal points 54 and 60 and consequently excellent isolation of the RF and bias systems.

In the illustrated embodiment the junction 54 between the diodes is maintained at approximately a positive voltage of 10 volts relative to ground while the center tap 60 of the inductance is maintained at about 5 volts above ground whereby the diodes 38 and 40 have a constant reverse D.C. bias of 5 volts. From the chart of FIG. 2, the curve 68 indicates that a bias voltage in the order of 5 volts results in a capacitance of approximately 100 mmf. and places the operating level of the diodes in a desirable relatively linear operating range. A D.C. potential is generated in the event that discriminator 42 senses a departure of the frequency being monitored from the optimum. In the described embodiment this potential may vary approximately three volts on either side of a zero value and is directly related to frequency shift. The discriminator voltage is applied to the grid of triode 48 through resistor 44 and appears as an output voltage with increased power capabilities at the cathode of that tube.

As is well known, no phase inversion and no voltage gain occurs in a cathode follower circuit and thus for a positive discriminator voltage the cathode also becomes more positive, raising the voltage at junction 54 and consequently raising the voltage between that junction and center tap 60. The increased voltage differential lowers the effective capacitance of diodes 38 and 40. The decreased capacitance results in a higher resonant frequency in tank 10 which in turn will result in corrective action throughout the circuits being controlled and consequently a reduction in the discriminator voltage toward zero. Conversely, a negative excursion of the discriminator voltage will result in a negative shift of the cathode of triode 48 and a decrease in the diode bias.

The control produced by cathode follower 48 and the remaining circuit described above is found to be very precise, fast and reliable. However, because of the quick response time of the circuit there is some hazard of instability and hunting as a result of transients, loop surges and the like. These are minimized through the use of a rate damping circuit. The grid of triode 50 is connected to ground through grid resistor 70 and thus triode 50 normally acts merely as a balancing circuit element. However, in the event of a rapid or substantial change in the discriminator voltage resulting in a substantial change in the voltage of the cathode of triode 48 this change is applied to the grid of triode 50 through a condenser 72. Condenser 72 in cooperation with grid resistor 70 effectively functions as a differentiating network which will apply an in-phase differentiated pulse to the grid of triode 50 for any rapid or substantial change in the voltage at the cathode of tube 48 and consequently at junction 54. Upon application of the in-phase pulse to the grid of tube 50, the cathode of that tube also experiences an in-phase shift correspondingly shifting the voltage level at center tap 60 of inductance 32. Thus, if junction 54 experiences a substantial positive voltage change a corresponding positive change will momentarily appear at center tap 60 minimizing any bias change on the diodes and any consequent frequency shift in the tank circuit. The duration of this damping characteristic is of course determined by the magnitude of differential capacitor 72 and associated resistor 70. This time constant can be predetermined by well known techniques.

To provide for effective operation of the automatic frequency control circuit it is sometimes desirable to mechanically tune the tank 10 to keep the unbiased resonant frequency somewhat near the predetermined optimum or center frequency. This is accomplished in the illustrated embodiment by connecting a motor 74 between the cathodes of triodes 48 and 50 and mechanically driving variable condenser 36 from motor 74. Motor 74 may be any appropriate bidirectional drive such as a bidirectional solenoid, D.C. wound rotary motor, a meter movement or the like. Also, if the power capabilities of tubes 48 and 50 are taxed, the cathodes of those tubes may be used as a signal source for energizing an additional amplifier which in turn is used to drive a motor or the like. The motor 74 will have sufficient inertia that it will not be energized to correct for small frequency shifts or transients. A substantial voltage drop will be required to actuate motor 74 and it will operate only very intermittently for substantial corrections.

Furthermore, the damping effect of the differentiating network will, as already described, raise the voltages at the cathodes of both triodes 48 and 50 equally for momentary surges and transients so that the voltage will not appear on motor 74 unless the signal is sustained for sufficient time to permit discharge of condenser 72. A meter 76 is also shown in FIG. 1 connected between the cathodes of triodes 48 and 50. The meter may be of any desired type having a zero center and may be calibrated either in voltage or in frequency deviation. As already described the voltage appearing across meter 76 will vary over a range of for example, plus or minus 5 volts and this might represent a frequency range of plus or minus 2 kilocycles. These values are merely illustrative and not intended in any way to limit the scope of the invention.

In one typical embodiment of this invention triode 16 was a portion of a 6AN8 and triodes 48 and 50 were combined in a single envelope of type 12AV7. A 105 volt supply was employed. Using these tubes and appropriate circuit components operation is in accordance with the foregoing description.

By employing the cathode follower circuit 14 the high impedance output from the discriminator 42 is transformed into a low impedance D.C. voltage which will not load the discriminator and will not result in back bias from rectified currents in the tank 10. Also, by employing the voltage dividers energized from a common source 18 for biasing junction 54 and center tap 60 the circuit is self-compensating for any changes in supply voltage. Furthermore the use of a second triode 50 in a balanced impedance transforming D.C. amplifier automatically compensates for any variations in B+ supply, heater supply, or tube characteristics as both triode 48 and triode 50 would be similarly affected and the real voltages at the two nodal points 54 and 60 would change in an identical manner producing no relative change.

In the particular embodiment described the low pass filter from discriminator 42 can also have reduced impedance without any deleterious effects. Resistor 44 may have a resistance in the order of 500,000 ohms and capacitance 46 may be in the order of 4 mf.

Without the novel circuit, and particularly the rate damping circuit, loop surges could be prevented only by greatly increasing the series resistance and the shunt capacitance.

While one particular embodiment of the invention has been described in great detail it will be immediately apparent that the tuning concept provided by this invention may be applied in many circuits adapted for automatic frequency control or automatic tuning of all kinds. The important advantages of precise rapid automatic tuning with balanced operation, lack of A.C. signals in the bias circuit, lack of back biasing, rate damping, and the like can be obtained through the use of the novel features of this invention irrespective of the environment where they are employed.

Without further elaboration, the foregoing will so fully explain the character of my invention that others may, by applying current knowledge, readily adapt the same for use under varying conditions of service, while retaining certain features which may properly be said to constitute the essential items of novelty involved, which items are intended to be defined and secured to me by the following claims.

I claim:

1. A variable oscillatory circuit adapted for operation at a predetermined frequency, comprising a tank circuit including inductance means and two opposed semiconductive capacitor means, each having a low impedance forward direction and a high impedance reverse direction, and connected seriatim across said inductive means, means for exciting said tank circuit with a periodic signal corresponding to the oscillations of said tank circuit, and means applying a bias voltage between a junction intermediate said capacitor means and a nodal connection on said inductance means, said means comprising a balanced amplifier including two amplifier components, one of said amplifier components receiving a control signal corersponding to the difference between said oscillations and said predetermined frequency and having an output applied to said junction, the other of said amplifier components having an output applied to said nodal connection, said amplifier components being otherwise similarly connected in said circuit.

2. A variable oscillatory circuit adapted for operation at a predetermined frequency, comprising a tank circuit including inductance means and two opposed semiconductive capacitor means, each having a low impedance forward direction and a high impedance reverse direction, and connected seriatim across said inductive means, means for exciting said tank circuit with a periodic signal corresponding to the oscillations of said tank circuit, and means applying a bias voltage between a junction intermediate said capacitor means and a nodal connection on said inductance means, said means comprising a source of fixed bias voltage in the reverse direction and a balanced amplifier including two amplifier components, one of said amplifier components receiving a control signal corresponding to the difference between said oscillations and said predetermined frequency and having an output applied to said junction, the other of said amplifier components having an output applied to said nodal connection, said amplifier components being otherwise similarly connected in said circuit.

3. A variable oscillatory circuit adapted for operation at a predetermined frequency, comprising a tank circuit including inductance means and two opposed semiconductive capacitor means, each having a low impedance forward direction and a high impedance reverse direction, and connected seriatim across said inductive means, means for exciting said tank circuit with a periodic signal corresponding to the oscillations of said tank circuit, means applying a bias voltage between a junction intermediate said capacitor means and a nodal connection on said inductance means, said means comprising a source of fixed bias voltage in the reverse direction and a balanced amplifier including two amplifier components, one of said amplifier components receiving a control signal corresponding to the difference between said oscillations and said predetermined frequency and having an output applied to said junction, the other of said amplifier components having an output applied to said nodal connection, said amplifier components being otherwise similarly connected in said circuit, and means for sensing the frequency difference between said oscillations and said predetermined frequency and generating said control signal.

4. A variable oscillatory circuit adapted for operation at a predetermined frequency, comprising a tank circuit including inductance means and two opposed semiconductive capacitor means, each having a low impedance forward direction and a high impedance reverse direction, and connected seriatim across said inductive means, means for exciting said tank circuit with a perdiodic signal corresponding to the oscillations of said tank circuit, means applying a bias voltage between a junction intermediate said capacitor means and a nodal connection on said inductance means, said means comprising a source of fixed bias voltage in the reverse direction and a balanced amplifier including two amplifier components, one of said amplifier components receiving a control signal corresponding to the difference between said oscillations and said predetermined frequency and having an output applied to said junction, the other of said amplifier components having an output applied to said nodal connection, said amplifier components being otherwise similarly connected in said circuit, differentiating network means connecting the output of said one of the amplifier components and the input of the other of said amplifier components to provide a damping signal in said circuit, and means for sensing the frequency difference between said oscillations and said predetermined frequency and generating said control signal.

5. A variable oscillatory circuit adapted for operation at a predetermined frequency, comprising a tank circuit including inductance means and two opposed semiconductive capacitor means, each having a low impedance forward direction and a high impedance reverse direction, and connected seriatim across said inductive means, means for exciting said tank circuit with a periodic signal corresponding to the oscillations of said tank circuit, means applying a bias voltage between a junction intermediate said capacitor means and a nodal connection on said inductance means, said means comprising a source of fixed bias voltage in the reverse direction and a balanced amplifier including two amplifier components, one of said amplifier components receiving a control signal corresponding to the difference between said oscillations and said predetermined frequency and having an output applied to said junction, the other of said amplifier components having an output applied to said nodal connection, said amplifier components being otherwise similarly connected in said circuit, differentiating network means connecting the output of said one of the amplifier components and the input of the other of said amplifier components to provide a damping signal in said circuit, indicator means indicating the magnitude and polarity of said variable bias voltage and thereby indicating the relationship of said oscillations to said predetermined frequency, and means for sensing the frequency difference between said oscillations and said predetermined frequency and generating said control signal.

6. A variable oscillatory circuit adapted for operation at a predetermined frequency, comprising a tank circuit including inductance means and two opposed semiconductive capacitor means, each having a low impedance forward direction and a high impedance reverse direction, and connected seriatim across said inductive means, means for exciting said tank circuit with a periodic signal corresponding to the oscillations of said tank circuit, means applying a bias voltage between a junction intermediate said capacitor means and a nodal connection on said inductance means, said means comprising a source of fixed bias voltage in the reverse direction and a balanced amplifier including two amplifier components, one of said amplifier components receiving a control signal corresponding to the difference between said oscillations and said predetermined frequency and having an output applied to said junction, the other of said amplifier components having an output applied to said nodal connection, said amplifier components being otherwise similarly connected in said circuit, differentiating network means connecting the output of said one of the amplifier components and the input of the other of said amplifier components to provide a damping signal in said circuit, variable capacitance means connected in parallel with said inductance means, bidirectional motor means driven by a difference voltage derived from said two amplifier components for adjusting said variable capacitance, and means for sensing the frequency difference between said oscillations and said predetermined frequency and generating said control signal.

7. A circuit for the automatic control of the oscillatory frequency of a signal relative to a predetermined frequency comprising a tank circuit including inductance means and two opposed semiconductive capacitor means, each having a low impedance forward direction and a high impedance reverse direction, said capacitance means being connected seriatim across said inductance means, means for exciting said tank circuit with a periodic signal corresponding to the oscillatory signal of said tank circuit, a frequency sensitive circuit energized from said tank circuit and adapted to generate a control voltage related in magnitude and polarity to the difference between said oscillatory frequency and said predetermined frequency, a balanced amplifier circuit comprising two similar tubes, each having a plate, a cathode and a control grid, said plates being connected to a common potential source and the grid of one of said tubes being energized from said frequency sensitive circuit, appropriate cathode resistors connecting said cathodes to said source, and an appropriate grid resistor connecting the control grid of the second of said tubes to said source, said one tube having its cathode connected to apply an output signal from said one tube to the juncture of said two capacitor means, and said second tube having its cathode connected to apply an output signal from said second tube to a nodal point on said inductance means.

8. The circuit of claim 7 wherein a capacitance is connected between the cathode of said one tube and the grid of said second tube to provide a differentiating circuit for rate damping of said circuit.

9. The circuit of claim 8 wherein a network is connected to the cathode of said one tube to maintain said junction at a predetermined potential and a similar network is connected to the cathode of said second tube to maintain said nodal point at a slightly different predetermined potential whereby said capacitor means are at all times biased in the reverse direction.

10. The circuit of claim 9 wherein a voltage sensitive meter is connected between said cathodes to indicate the operation of said circuit and the tuning of said tank circuit.

11. The circuit of claim 9 wherein a mechanically variable capacitor is connected across said inductance means and bidirectional motor means is connected between said cathodes to drive said variable capacitor whereby said tank circuit may be mechanically tuned by said motor to coarsely adjust the frequency of said tank circuit in the range of said predetermined frequency.

12. The circuit of claim 1 wherein a capacitance is effectively connected between the output connection of said one amplifier component and the input of said other amplifier component to provide a differentiating network for rate damping of said circuit.

References Cited in the file of this patent

UNITED STATES PATENTS

| | | |
|---|---|---|
| 2,505,642 | Hugenholtz et al. | Apr. 25, 1950 |
| 2,936,428 | Schweitzer | May 10, 1960 |

OTHER REFERENCES

Article by J. L. Jenkins in Electrical Manufacturing, December 1954, pages 83–88, 300, 302.

Article by Hammerslag in Electronics, Sept. 18, 1959, pages 48 to 50.